(12) United States Patent
Patel et al.

(10) Patent No.: US 7,864,607 B2
(45) Date of Patent: Jan. 4, 2011

(54) NEGATIVE VOLTAGE DISCHARGE SCHEME TO IMPROVE SNAPBACK IN A NON-VOLATILE MEMORY

(75) Inventors: Vipul Patel, San Jose, CA (US); Stephen Gualandri, Morgan Hills, CA (US)

(73) Assignee: Micron Technology, Inc., Boise, ID (US)

( * ) Notice: Subject to any disclaimer, the term of this patent is extended or adjusted under 35 U.S.C. 154(b) by 845 days.

(21) Appl. No.: 11/776,221

(22) Filed: Jul. 11, 2007

(65) Prior Publication Data

US 2007/0258302 A1    Nov. 8, 2007

Related U.S. Application Data

(63) Continuation of application No. 11/178,683, filed on Jul. 12, 2005, now Pat. No. 7,248,521.

(51) Int. Cl.
*G11C 7/00* (2006.01)
(52) U.S. Cl. ............. 365/204; 365/185.25; 365/185.29; 365/218
(58) Field of Classification Search ............ 365/185.25, 365/185.29, 204, 218
See application file for complete search history.

(56) References Cited

U.S. PATENT DOCUMENTS

| | | | |
|---|---|---|---|
| 5,617,356 A | 4/1997 | Golla et al. | |
| 5,719,807 A | 2/1998 | Sali et al. | |
| 6,031,774 A * | 2/2000 | Chung | ......................... 365/204 |
| 6,438,032 B1 | 8/2002 | Pekny et al. | |
| 6,667,910 B2 | 12/2003 | Abedifard et al. | |
| 6,944,059 B2 * | 9/2005 | Macerola | ................ 365/185.25 |
| 7,012,456 B1 * | 3/2006 | Hirose et al. | ................. 327/328 |

FOREIGN PATENT DOCUMENTS

| | | |
|---|---|---|
| EP | 0 190 027 A2 | 8/1986 |
| EP | 0668593 A1 * | 8/1995 |
| JP | 7-326195 | 12/1995 |

OTHER PUBLICATIONS

English abstract for JP7326195A, published Dec. 12, 1995.*

* cited by examiner

*Primary Examiner*—Dang T Nguyen
*Assistant Examiner*—Alexander Sofocleous
(74) *Attorney, Agent, or Firm*—Dickstein Shapiro LLP

(57) ABSTRACT

Charge pump and discharge circuitry for a non-volatile memory device that splits up the discharge operation into two discharge periods. In a first discharge period, the voltage being discharged (e.g., erase voltage) is discharged through a pair of discharge transistors until the discharging voltage reaches a first voltage level. The path through the pair of discharge transistors is controlled by an intermediate control voltage so that none of the transistors of the pair enter the snapback condition. In the second discharge period, the remaining discharging voltage is fully discharged from the first level through a third discharge transistor.

22 Claims, 6 Drawing Sheets

NEGATIVE VOLTAGE DISCHARGE SCHEME TO IMPROVE SNAPBACK IN A NON-VOLATILE MEMORY

This application is a continuation of application Ser. No. 11/178,683, filed Jul. 12, 2005, now U.S. Pat. No. 7,248,521 which is hereby incorporated by reference in its entirety.

FIELD OF THE INVENTION

The invention relates generally to non-volatile memory devices and more particularly to a discharge scheme for non-volatile memory devices.

BACKGROUND

A non-volatile memory is a type of memory device that retains stored data when power is removed. There are various types of non-volatile memories including e.g., read only memories (ROMs), erasable programmable read only memories (EPROMs), and electrically erasable programmable read only memories (EEPROMs). One type of EEPROM device is the flash EEPROM device (also referred to as "flash memory")

Each non-volatile memory device has its own unique characteristics. For example, the memory cells of an EPROM device are erased using an ultraviolet light, while the memory cells of an EEPROM device are erased using an electrical signal. In a conventional flash memory device blocks of memory cells are simultaneously erased. The memory cells in a ROM device, on the other hand, cannot be erased at all. EPROMs, EEPROMs and flash memory are commonly used in computer systems that require reprogrammable non-volatile memory.

A conventional flash memory device includes a plurality of memory cells, each cell is provided with a floating gate covered with an insulating layer. There is also a control gate which overlays the insulating layer. Below the floating gate is another insulating layer sandwiched between the floating gate and the cell substrate. This insulating layer is an oxide layer and is often referred to as the tunnel oxide. The substrate contains doped source and drain regions, with a channel region disposed between the source and drain regions.

In a flash memory device, a charged floating gate represents one logic state, e.g., a logic value "0," while a non-charged floating gate represents the opposite logic state e.g., a logic value "1." The flash memory cell is programmed by placing the floating gate into one of these charged states. A flash memory cell is unprogrammed, or erased, when the charge is removed from the floating gate.

One method of programming a flash memory cell is accomplished by applying a known potential to the cell's drain and a programming potential to its control gate. This causes electrons to be transferred from the source to the floating gate of the memory cell. The programming action of transferring electrons to the floating gate results in a memory cell that conducts less current when read than it would otherwise in the un-programmed state.

Large negative voltages up to e.g., −9.5V are often used when erasing a flash memory cell. Once the erase operation is finished, the large negative voltage (VN) must be discharged to a ground potential (e.g., 0V) in a fixed period of time. Typically, an n-channel pull-down transistor is used to discharge the voltage VN. Because this n-channel "discharge" transistor will have the large negative voltage VN (e.g., −9.5V) across its source/drain terminals, the discharge transistor is prone to the phenomenon known as "snapback."

MOSFET snapback is typically defined as a phenomenon in which a MOSFET switches from a high voltage/low current state to a low voltage/high current state by activating the parasitic bipolar device between the MOSFET source, body and drain. A trigger voltage, Vt, is the voltage at which the regenerative effects associated with MOSFET snapback begin.

As is known in the art, a transistor is susceptible to snapback when it has a high field across it drain region (i.e., a large voltage across its source/drain). If the transistor is activated too quickly, snapback may occur. That is, snapback occurs when the parasitic bipolar transistor that exists between the source and drain (for ESD purposes) amplifies the current that results from activating the transistor. This snapback phenomenon results in a very high current between the source and drain regions of the transistor, which is undesirable and may alter the performance of the memory device.

U.S. Pat. No. 6,438,032, assigned to Micron Technology, Inc., and hereby incorporated by reference herein, discloses one technique for controlling a discharge transistor to avoid problems, such as snapback. FIG. 1 is an illustration of charge pump and discharge circuitry 50 incorporating the technique disclosed in the '032 patent. The circuitry 50 includes a charge pump 316, discharge control circuit 324, NMOS discharge transistor 288, discharge control capacitor 292, an NMOS transistor 286 and a PMOS transistor 218

The charge pump 316 is responsible for generating an elevated erase voltage VN required for the erasure of non-volatile memory cells of the memory device containing the circuitry 50. The charge pump 316 is enabled by an active (i.e., high) erase signal ERASEP when the memory device containing circuitry 50 performs an erase operation. The erase voltage VN generated by the charge pump 316 is placed on signal output line 258, which is connected to an array of non-volatile memory cells (not shown in FIG. 1). After an erase operation takes place, the ERASEP signal transitions to inactive (i.e., low), deactivating the charge pump 316 and enabling the discharge control circuit 324.

The discharge control circuit 324 controls the discharge of the remaining voltage from the charge pump output 258 to ground through NMOS discharge transistor 288. Discharge transistor 288 is normally turned off by capacitor 292. During discharge, the gate of the discharge transistor 288 is raised by a discharge control signal DISCHARGE so that the transistor 288 operates in a linear region for a specified time period to discharge a portion of the pump voltage in a controlled, ramped manner before being driven into saturation to quickly discharge any remaining portion of the pump voltage.

The operation of the circuitry 50 is now described in slightly more detail. When the memory device performs an erase operation, the charge pump 316 is active and provides the erase voltage VN at signal output line 258. The charge pump 316, when active, turns on NMOS transistor 286, which couples circuit node 290 to the erase voltage VN on output line 258. The presence of the negative erase voltage VN on circuit node 290 ensures that the NMOS discharge transistor 288 is inactive and not conducting to ground while the charge pump 316 is active. Additionally, the coupling of the negative erase voltage VN to node 290 charges the discharge control capacitor 292 to the voltage VN. The charge pump 316, while active, also turns off PMOS transistor 218, which isolates the discharge control circuit 324 from circuit node 290 and the negative erase voltage VN.

After an erase operation, the ERASEP signal becomes inactive (low) and the charge pump 316 is deactivated. NMOS transistor 286 is turned off, isolating circuit node 290 from the voltage on the signal output line 258. At the same time, the PMOS transistor 218 is turned on, which couples the discharge control circuit 324 to circuit node 290, which is maintained at the negative erase voltage VN by the charged discharge control capacitor 292. The inactive (low) ERASEP signal also enables the discharge control circuit 324, which provides a control signal DISCHARGE (or current flow) to circuit node 290 through the PMOS transistor 218. This control signal DISCHARGE gradually charges the discharge control capacitor 292. As the discharge control capacitor 292 charges, the voltage signal on circuit node 290 gradually rises from the negative erase voltage VN to a supply voltage VCC. Circuit node 290 is coupled to the gate of the NMOS discharge transistor 288 and the rising voltage on circuit node 290 activates the discharge transistor 288 to slowly discharge the residual voltage from signal output line 258 and the disabled charge pump 316.

After discharge of the residual voltage from signal output line 258, the discharge control circuit 324 maintains a bias on the gate of the discharge transistor 288. This keeps the discharge transistor 288 enabled until the next erase operation.

Thus, as shown in FIG. 2, the '032 patent discloses activating the discharge transistor 288 (i.e., using the slowly ramping DISCHARGE control signal) over a period time Z (i.e., discharge time) to discharge the large negative erase voltage VN (e.g., −9.5V) to the ground potential (e.g., 0V). The inventors of the present invention have discovered that the snapback phenomenon depends on other factors, in addition to discharge time, such as the source/drain voltage across the discharge transistor 288. Thus, it is desirable to control the source/drain voltage across the discharge transistor 288 of a non-volatile memory device to substantially mitigate the effects of snapback and to improve the overall efficiency and operation of the memory device.

SUMMARY

The invention provides a mechanism to control the source/drain voltage across a discharge transistor of a non-volatile memory device to substantially mitigate the effects of snapback and to improve the overall efficiency and operation of the memory device.

The above and other features and advantages are achieved in various exemplary embodiments of the invention by providing charge pump and discharge circuitry for a non-volatile memory device that splits up the discharge operation into two discharge periods. In a first discharge period, the voltage being discharged (e.g., erase voltage) is discharged through a pair of discharge transistors until the discharging voltage reaches a first voltage level. The path through the pair of discharge transistors is controlled by an intermediate control voltage so that none of the transistors of the pair enter the snapback condition. In the second discharge period, the remaining discharging voltage is fully discharged from the first level through a third discharge transistor.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION

Figure 3:
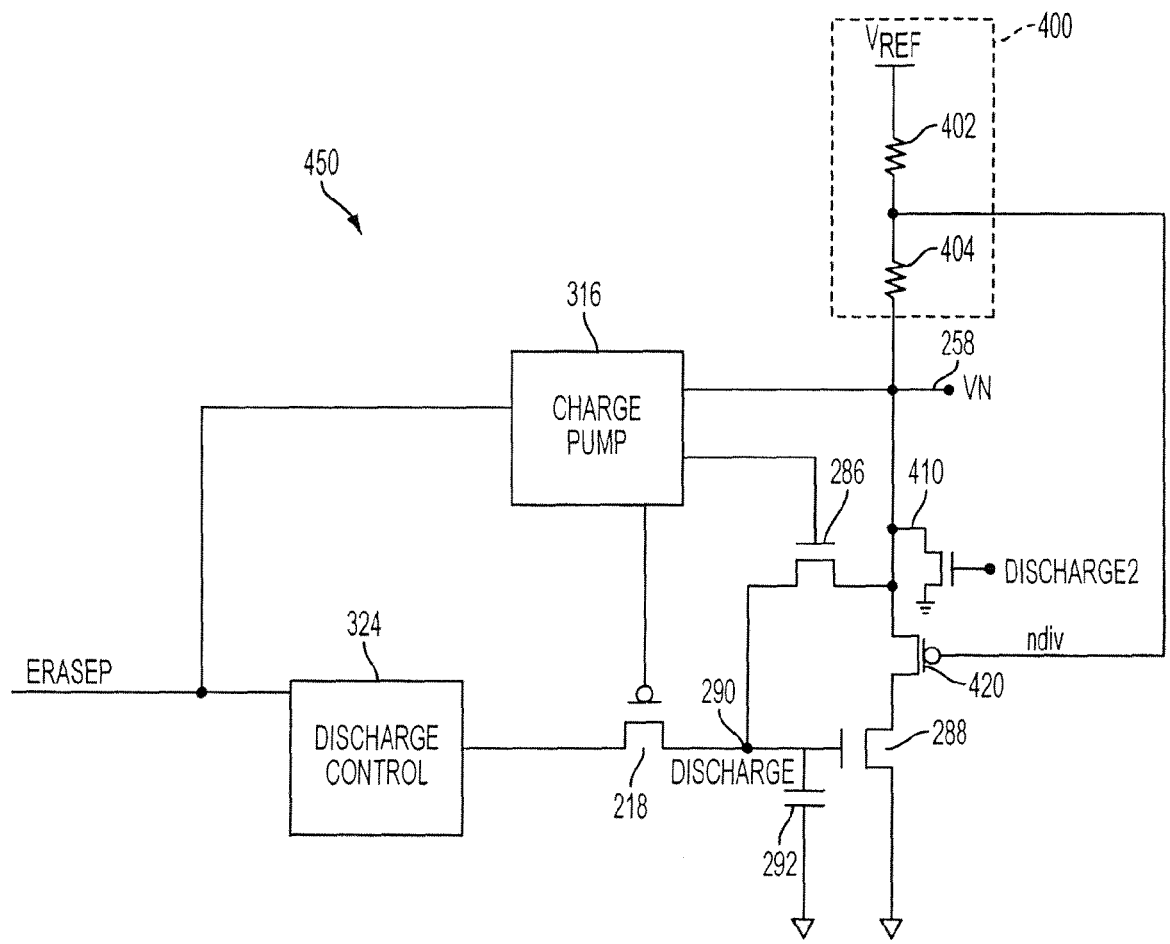
FIG. 3 illustrates charge pump and discharge circuitry for a non-volatile memory device constructed in accordance with an embodiment of the invention.

FIG. 3 illustrates charge pump and discharge circuitry 450 for a non-volatile memory device constructed in accordance with an embodiment of the invention. The circuitry 450 includes a charge pump 316, discharge control circuit 324, first NMOS discharge transistor 288, discharge control capacitor 292, NMOS transistor 286, second NMOS discharge transistor 410, PMOS transistor 218, PMOS discharge transistor 420 and a voltage generator circuit 400. In the illustrated embodiment, the voltage generator circuit 400 includes two resistors 402, 404 connected as a voltage divider between a reference voltage VREF and line 258. The output of the generator is an intermediate negative voltage NDIV (described in more detail below).

Figure 1:
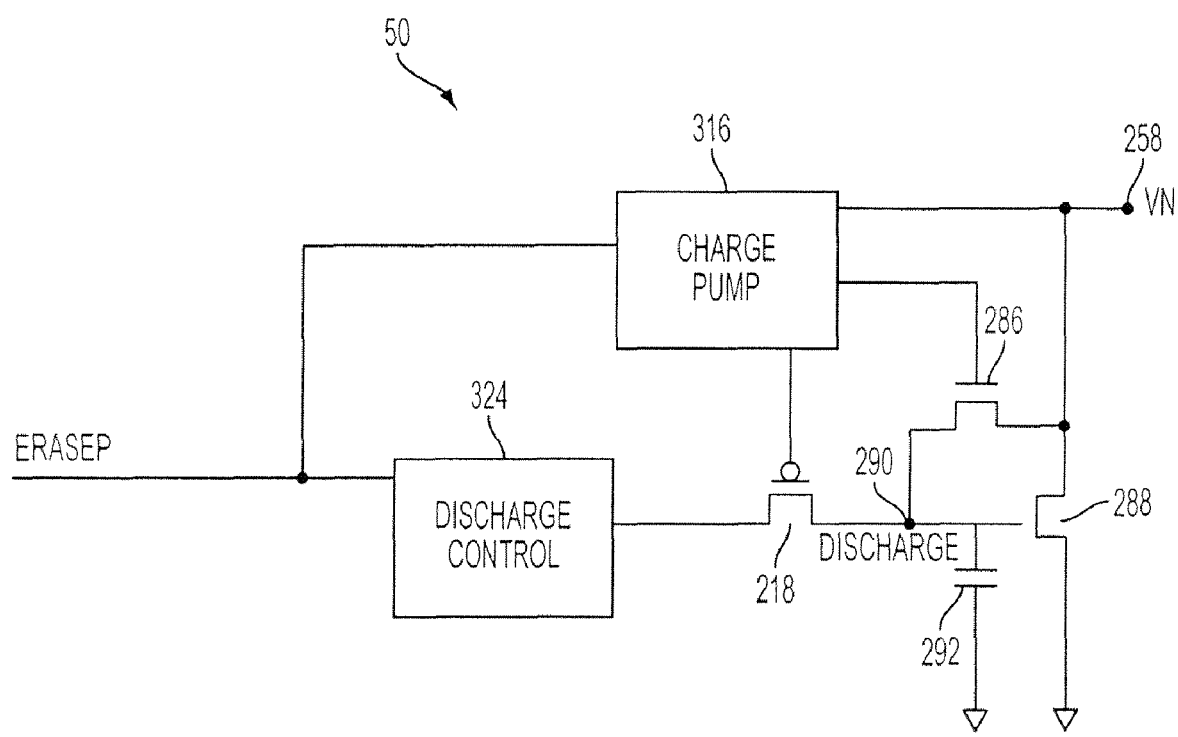
FIG. 1 illustrates conventional charge pump and discharge circuitry for a non-volatile memory device.

Circuitry 450 is constructed in a similar manner as the conventional charge pump and discharge circuitry 50 illustrated in FIG. 1 except for the following modifications. The PMOS discharge transistor 420 is connected in series with the first NMOS discharge transistor 288. The PMOS discharge transistor 420 has its gate terminal connected to receive the intermediate negative voltage NDIV from the voltage generator circuit 400. In addition, the second NMOS discharge transistor 410 is connected in parallel with the other discharge transistors 420, 288. The second NMOS discharge transistor 410 is controlled by a second discharge control signal DISCHARGE2 (discussed below in more detail).

Figure 4:
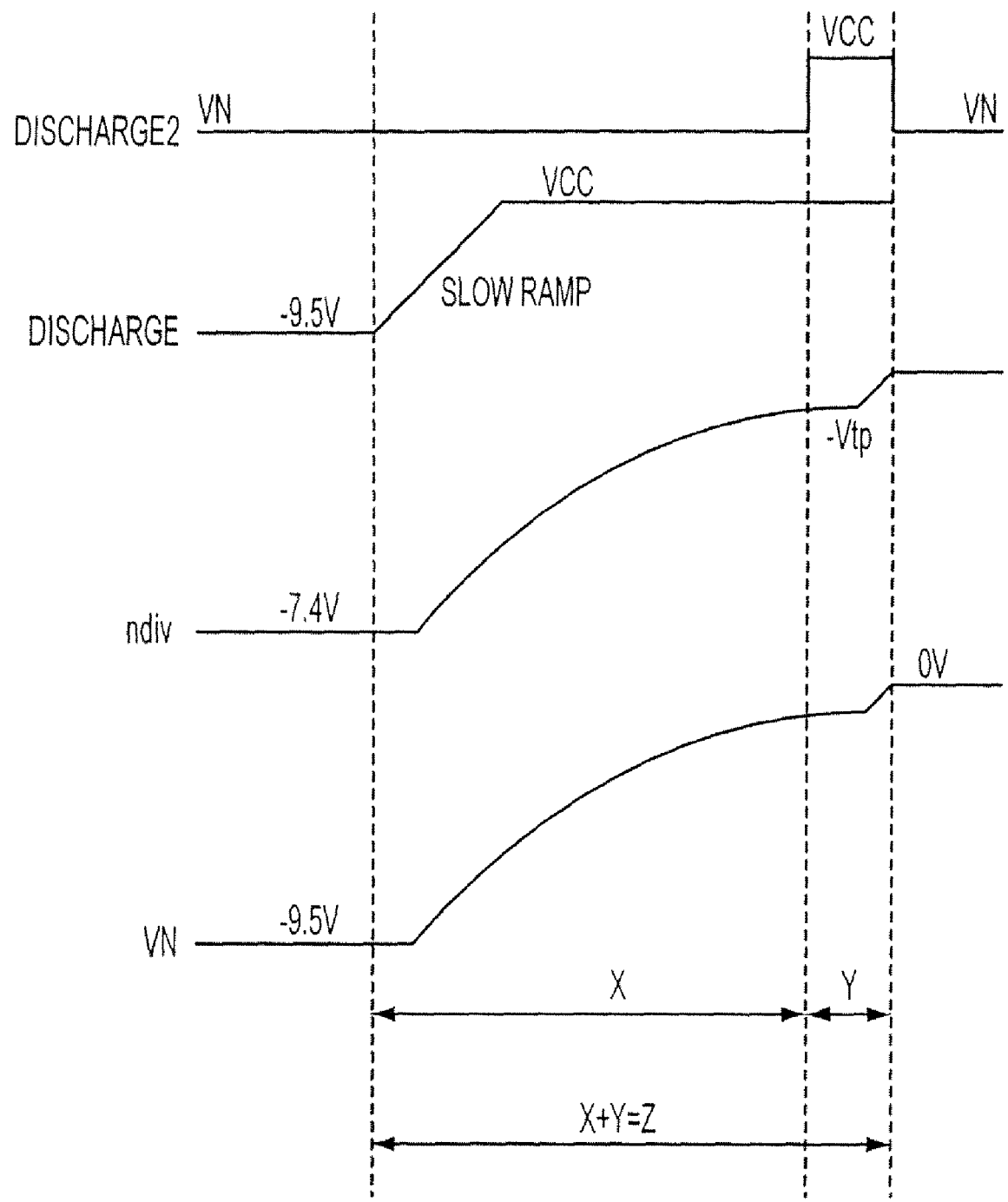
FIG. 4 illustrates discharge characteristics of portions of the FIG. 3 circuitry.
Figure 5:
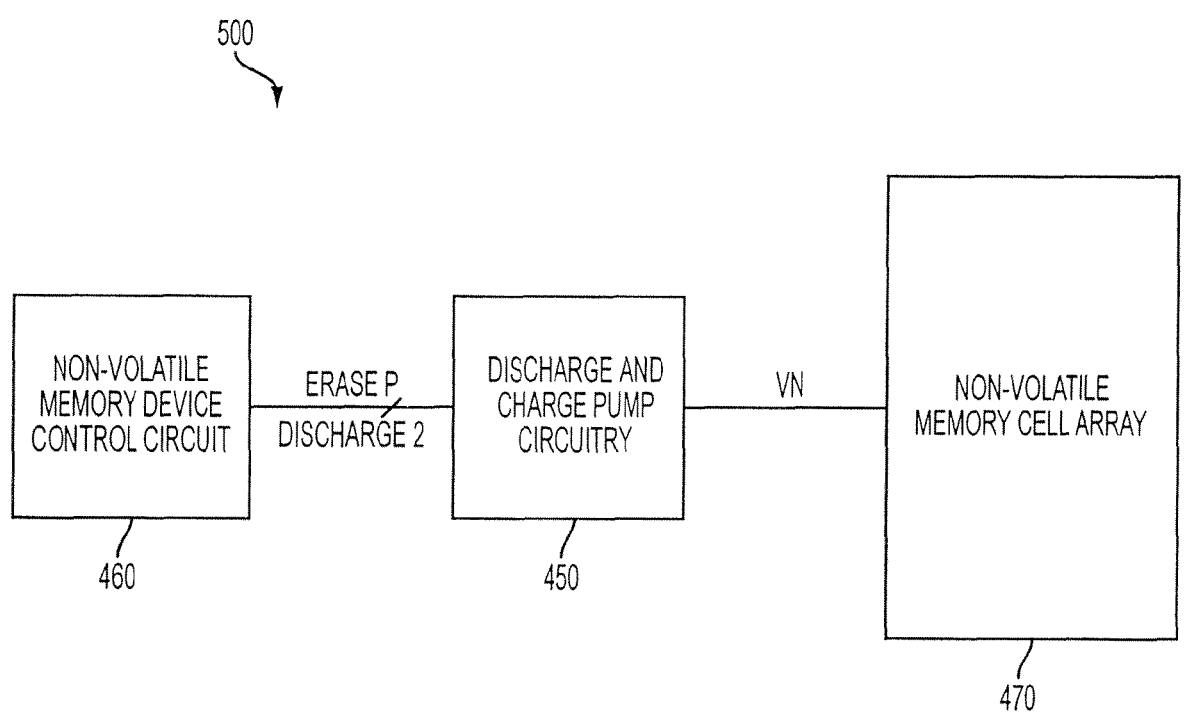
FIG. 5 illustrates a memory device constructed in accordance with an embodiment of the invention.

With reference to FIGS. 3-5, the operation of the charge pump and discharge circuitry 450 of the invention is now described. Initially, the circuitry operates in the same manner as the conventional circuitry 50 (FIG. 1) for an erase operation. That is, the charge pump 316 is responsible for generating an elevated erase voltage VN required for the erasure of non-volatile memory cells of the memory device containing the circuitry 450. The charge pump 316 is enabled by an active (i.e., high) erase signal ERASEP when the memory device containing circuitry 450 performs the erase operation. The charge pump 316, when active, turns on NMOS transistor 286, which couples circuit node 290 to the erase voltage VN on output line 258. The presence of the negative voltage VN on circuit node 290 ensures that NMOS discharge transistor 288 is inactive and not conducting while the charge pump 316 is active. Additionally, the coupling of the negative erase voltage VN to node 290 charges the discharge control capacitor 292 to the negative erase voltage VN. The charge pump 316, while active, also turns off PMOS transistor 218, which isolates the discharge control circuit 324 from circuit node 290 and the negative erase voltage VN.

The erase voltage VN generated by the charge pump 316 is placed on signal output line 258, which is connected to an array of non-volatile memory cells 470 (see FIG. 5). After an erase operation takes place, the ERASEP signal transitions to inactive (i.e., low), deactivating the charge pump 316 and enabling the discharge control circuit 324.

At this point, the operation of the circuitry 450 of the invention differs from the conventional circuitry 50 of FIG. 1. According to the present invention, the remaining erase voltage from the charge pump output 258 is discharged through the first NMOS discharge transistor 288 and the PMOS discharge transistor 420. PMOS discharge transistor is controlled by the intermediate negative voltage NDIV output from the generator 400.

After the erase operation, the ERASEP signal becomes inactive (low) and the charge pump 316 is deactivated. NMOS transistor 286 is turned off, isolating circuit node 290 from the voltage on the signal output line 258. At the same time, the PMOS transistor 218 is turned on, which couples the discharge control circuit 324 to circuit node 290, which is maintained at the negative erase voltage VN by the charged discharge control capacitor 292. The inactive (low) ERASEP signal also enables the discharge control circuit 324, which generates a discharge control signal DISCHARGE. The discharge control signal DISCHARGE gradually charges the discharge control capacitor 292. As the discharge control capacitor 292 charges, the voltage signal on circuit node 290 gradually rises from the negative erase voltage VN to a supply voltage VCC. Circuit node 290 is coupled to the gate of the first NMOS discharge transistor 288 and the rising voltage on circuit node 290 activates the first NMOS discharge transistor 288 to slowly discharge the residual erase voltage from signal output line 258 and the disabled charge pump 316.

NMOS discharge transistor 288 operates in a linear region for a specified time period in a controlled, ramped manner (i.e., "slow ramp" on FIG. 4) before being driven into saturation (i.e., VCC on FIG. 4). During this same discharge time period X (FIG. 4), the PMOS discharge transistor 420 is activated by the intermediate negative voltage NDIV output from the generator 400. As such, the amount of source/drain voltage across the first NMOS discharge transistor 288 is reduced from VN to approximately NDIV−Vtp, where Vtp is the threshold voltage of the PMOS discharge transistor 420. This prevents snapback from occurring during the discharge operation. According to the invention, the generator 400 can be configured to ensure that the intermediate negative voltage NDIV is low enough to ensure that snapback does not occur at the first NMOS discharge transistor 288.

The PMOS discharge transistor 420 will turn off at the end of discharge period X, when the discharging negative voltage NDIV reaches −Vtp (i.e., the threshold voltage of the PMOS discharge transistor 420). Since, as shown in FIG. 4, the negative voltage VN has not been fully discharged at this point, the circuitry 450 undergoes a second discharge period Y. During the second discharge period Y, the second NMOS discharge transistor 410 is activated to pull the remaining erase voltage to ground. Second NMOS discharge transistor 410 is activated by a second discharge control signal DISCHARGE2, which is generated by the non-volatile memory device's control circuit 460 (FIG. 5) when PMOS discharge transistor 420 turns off.

Figure 2:
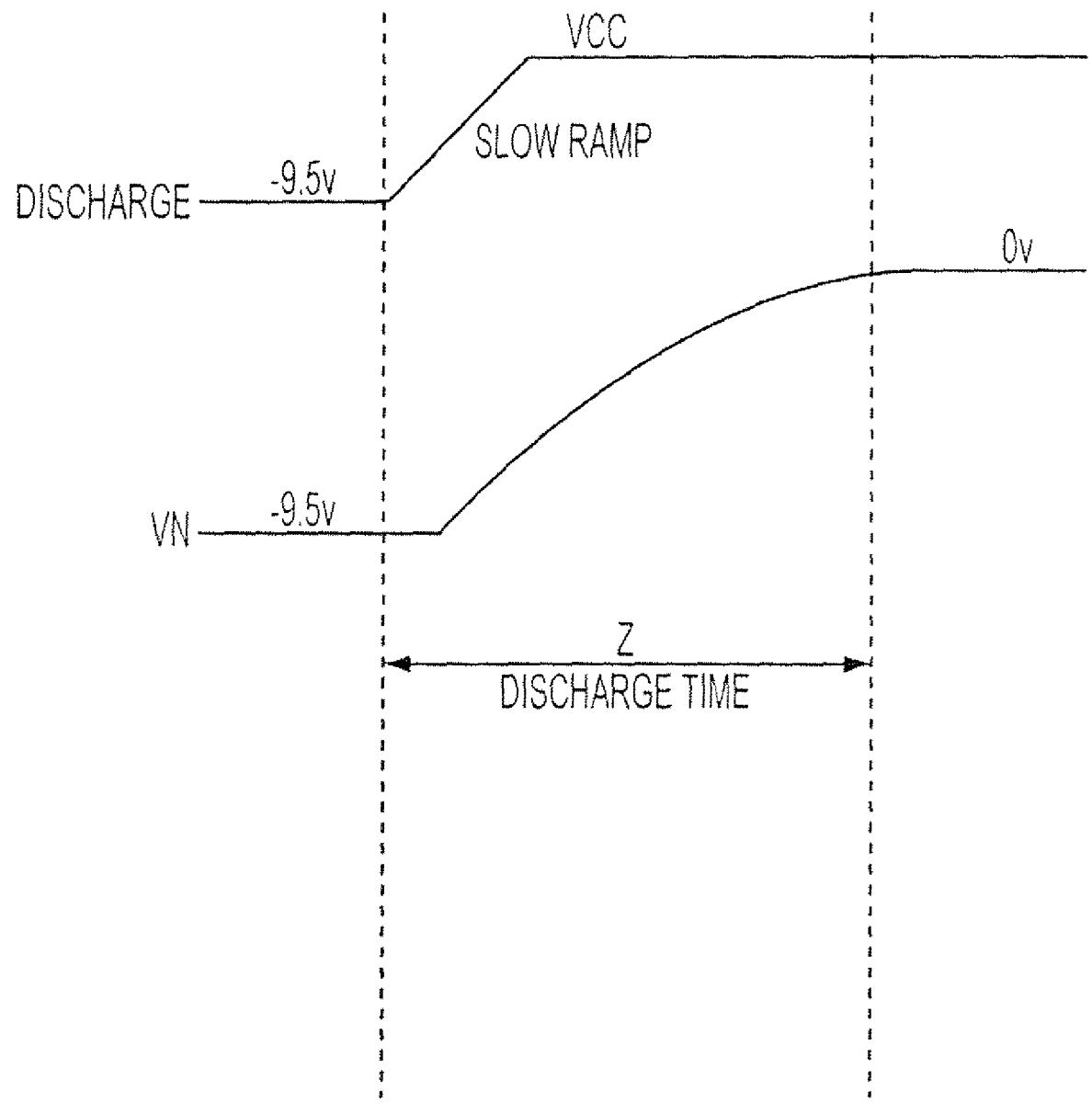
FIG. 2 illustrates discharge characteristics of portions of the FIG. 1 circuitry.

As can be seen in FIG. 4, the total discharge time Z is the combination of the first and second discharge periods (i.e., Z−X+Y). As explained above, the first discharge period X includes the main discharge of VN while the second discharge period includes the discharge to ground. The total discharge time Z, however, is the same as the discharge time Z illustrated in FIG. 2 regarding the conventional discharge technique. As such, the invention prevents snapback without increasing the discharge time. The invention also ensures that the circuitry 450 and the memory device itself does not suffer from the effects of snapback.

According to the illustrated embodiment, by selecting the point in the resistor voltage divider circuit of the generator 400 to tap from, the invention can precisely control the exact value of the intermediate negative voltage NDIV applied to the gate of the PMOS discharge transistor 420. As described above, the amount of source/drain voltage seen across the first NMOS discharge transistor 288 is controlled by the intermediate voltage NDIV instead of the large negative voltage VN. It should be appreciated, however, that any type of voltage generator or voltage divider circuit may be used as the voltage generator 400. For example, the generator 400 could comprise series connected transistors having impedances that could generate the desired voltage NDIV from the reference voltage VREF. In addition, the generator 400 could be analog or digital circuitry that may be controlled to output the desired voltage NDIV.

Figure 6:
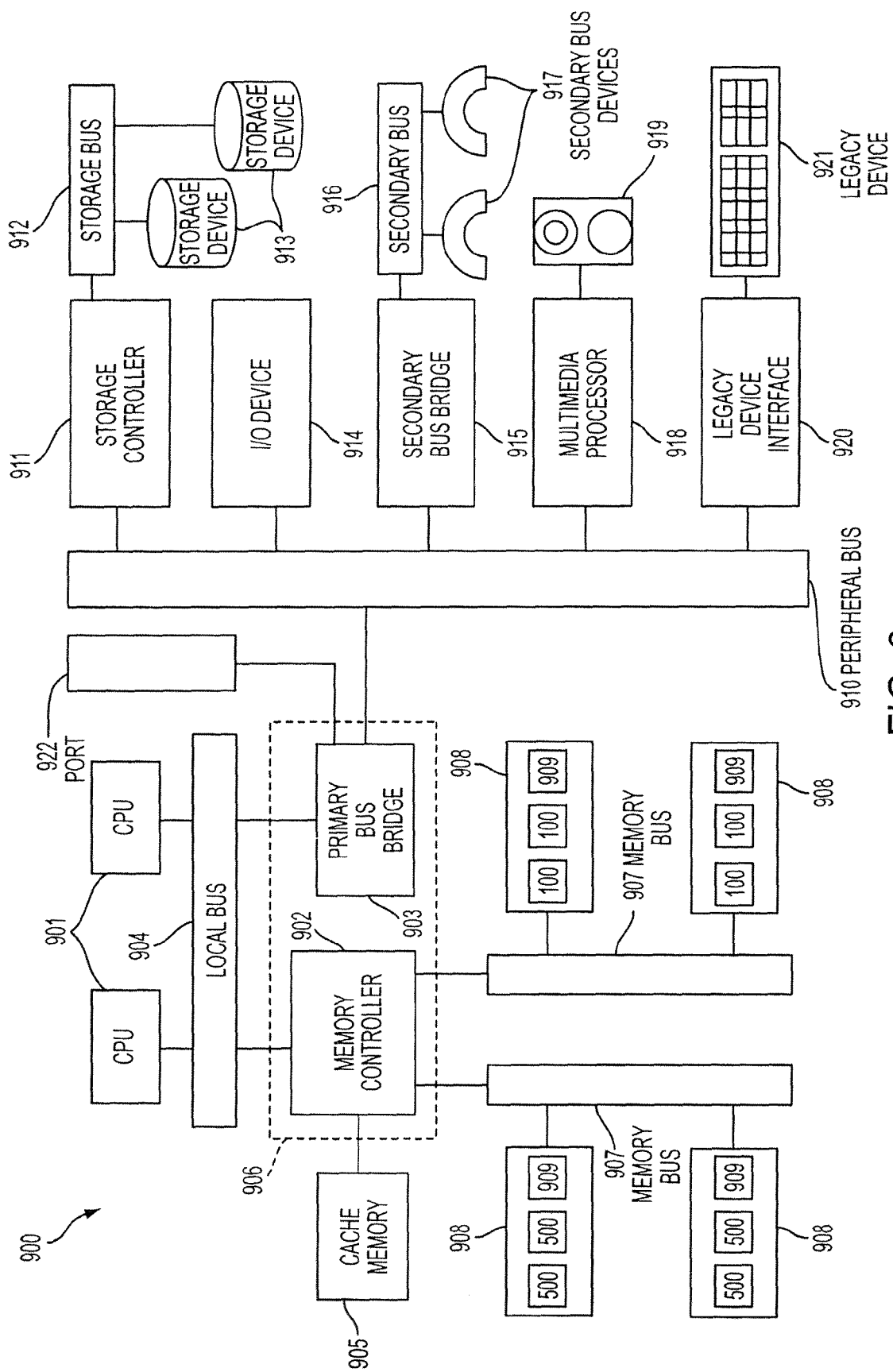
FIG. 6 shows a processor system incorporating at least one memory device constructed in accordance with an embodiment of the invention.

FIG. 6 shows a processor system 900 that may utilize a memory device 500 incorporating one of the embodiments of the invention. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus 907 accepts memory components 908 which include at least one memory device 500 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and a legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge 915 may be used to interface additional devices via another bus to the processing system. For example, the secondary bus bridge 915 may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices 921, for example, older styled keyboards and mice, to the processing system 900.

The processing system 900 illustrated in FIG. 6 is only an exemplary processing system that may use the memory devices of the invention. While FIG. 6 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 500. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

What is claimed as new and desired to be protected by Letters Patent of the United States is:

1. Pump and discharge circuitry comprising:
    a charge pump operable to provide a pump voltage on a line; and
    a discharge circuit adapted to operate a first discharge transistor in a linear region for a first time period to discharge at least a portion of the pump voltage in a ramped manner and to control a source to drain voltage across the first discharge transistor.
2. The circuitry of claim 1, wherein said discharge circuit further comprises a second discharge transistor, said discharge circuit being adapted to operate the second discharge transistor to discharge a remaining portion of the pump voltage during a second time period.
3. The circuitry of claim 2, wherein the second discharge transistor is connected in parallel with the first discharge transistor.
4. The circuitry of claim 2, wherein the first discharge transistor is controlled by a first control signal generated by the discharge circuit and the second discharge transistor is controlled by a second control signal input from another device.
5. The circuitry of claim 1, wherein the discharge circuit further comprises a complimentary transistor controlled by a voltage generated by a voltage generator, said complementary transistor controlling the source to drain voltage across the first discharge transistor during the first time period.
6. The circuitry of claim 5, wherein the voltage generated by the voltage generator has a potential between a potential of the pump voltage generated by the pump and a potential of the remaining pump voltage after the first period.
7. The circuitry of claim 1, wherein said discharge circuit further comprises a control circuit for generating a control signal for operating the first discharge transistor during the first time period.
8. The circuitry of claim 7, wherein said discharge circuit further comprises a switching transistor connected between the control circuit and a gate terminal of the first discharge transistor, said switching transistor being controlled by the pump to disconnect the first discharge transistor from the control signal when discharging of the pump voltage is not required.
9. The circuitry of claim 8, wherein said discharge circuit further comprises a capacitor connected to a node between the switching transistor and the gate of the first discharge transistor.
10. A memory device comprising:
    an array of memory cells;
    a charge pump for providing an output voltage on an output line connected to said array, said output voltage having a first potential; and
    a discharge circuit coupled to the output voltage, said circuit being adapted to operate a first discharge transistor in a linear region for a first time period to discharge the pump voltage from the first potential to a second potential in a ramped manner and to control a source to drain voltage across the first discharge transistor.
11. The memory device of claim 10, wherein said discharge circuit further comprises a second discharge transistor, said discharge circuit being adapted to operate the second discharge transistor to discharge the pump voltage from the second potential to a third potential during a second time period.
12. The memory device of claim 11, wherein the first potential is an erase voltage used by the array, the second potential is an intermediate voltage and the third potential is a ground potential.
13. The memory device of claim 11, wherein the second discharge transistor is connected in parallel with the first discharge transistor.
14. The memory device of claim 11, wherein the first discharge transistor is controlled by a first control signal generated by the discharge circuit and the second discharge transistor is controlled by a second control signal input from the array.
15. The memory device of claim 10, wherein the discharge circuit further comprises:
    a voltage generator adapted to generate a control voltage; and
    a complimentary transistor controlled by the control voltage, said complementary transistor controlling the source to drain voltage across the first discharge transistor during the first time period.
16. The memory device of claim 15, wherein said voltage generator comprises a voltage divider for generating the control voltage from a reference voltage.
17. A memory device comprising:
    an array of memory cells;
    a charge pump for providing an output voltage on an output line connected to said array, said output voltage having a first potential; and
    a discharge circuit coupled to the output voltage, said discharge circuit comprising:
        a voltage generator adapted to generate a control voltage,
        a first discharge transistor adapted to be activated by the control voltage, a second discharge transistor adapted to be activated by a first discharge control signal, a third discharge transistor adapted to be activated by a second discharge control signal, and a control circuit adapted to generate the first discharge control signal, wherein said first and second discharge transistors are adapted to discharge the output voltage from the first potential to a second potential during a first time period in response to the control voltage and first discharge control signal, and the third discharge transistor is adapted to discharge the output voltage from the second potential to a third potential in response to the second discharge control signal during a second time period.

18. The memory device of claim 17, wherein the second discharge transistor is operated in a ramped manner during the first time period.

19. The memory device of claim 17, wherein the first discharge transistor controls a source to drain voltage across the second discharge transistor during the first time period.

20. The memory device of claim 17, wherein the second discharge control signal is generated by a control circuit for the array.

21. The memory device of claim 17, wherein the voltage generator comprises a voltage divider adapted to generate the control voltage from a reference voltage.

22. The memory device of claim 17, wherein the voltage generated by the voltage generator has a potential between the first potential and the second potential.

* * * * *